(12) United States Patent
Lin et al.

(10) Patent No.: US 8,941,248 B2
(45) Date of Patent: Jan. 27, 2015

(54) SEMICONDUCTOR DEVICE PACKAGE AND METHOD

(71) Applicant: Taiwan Semiconductor Manufacturing Company, Ltd., Hsin-Chu (TW)

(72) Inventors: Wen-Yi Lin, New Taipei (TW);
Ming-Chih Yew, Hsin-Chu (TW);
Cheng-Yi Hong, Hsin-Chu (TW);
Po-Yao Lin, Zhudong Township (TW);
Kuo-Chuan Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 13/800,383

(22) Filed: Mar. 13, 2013

(65) Prior Publication Data

US 2014/0264813 A1 Sep. 18, 2014

(51) Int. Cl.
*H01L 23/31* (2006.01)
*H01L 23/28* (2006.01)
*H01L 21/56* (2006.01)
*H01L 23/34* (2006.01)

(52) U.S. Cl.
CPC .............. *H01L 23/28* (2013.01); *H01L 21/563* (2013.01); *H01L 23/34* (2013.01)

USPC .......................................... 257/778; 438/126

(58) Field of Classification Search
CPC ............................. H01L 23/3135; H01L 23/04
USPC .................. 257/734, 774, 777, 778; 438/126
See application file for complete search history.

(56) References Cited

U.S. PATENT DOCUMENTS

| 6,590,292 B1 * | 7/2003 | Barber et al. ................. 257/778 |
| 2001/0013392 A1 * | 8/2001 | Carden et al. ................ 156/329 |
| 2004/0195701 A1 * | 10/2004 | Attarwala ..................... 257/783 |
| 2011/0156235 A1 * | 6/2011 | Yuan ............................ 257/690 |

* cited by examiner

*Primary Examiner* — Thomas L Dickey
(74) *Attorney, Agent, or Firm* — Slater & Matsil, L.L.P.

(57) ABSTRACT

Various packages and methods of forming packages are disclosed. In an embodiment, a package includes a hybrid encapsulant encapsulating a chip attached to a substrate. The hybrid encapsulant comprises a first molding compound and a second molding compound that has a different composition than the first molding compound. In another embodiment, a package includes an encapsulant encapsulating a chip attached to a substrate. A surface of the chip is exposed through the encapsulant. The encapsulant comprises a recess in a surface of a first molding compound proximate the surface of the chip. A thermal interface material is on the surface of the chip and in the recess, and a lid is attached to the thermal interface material.

20 Claims, 6 Drawing Sheets

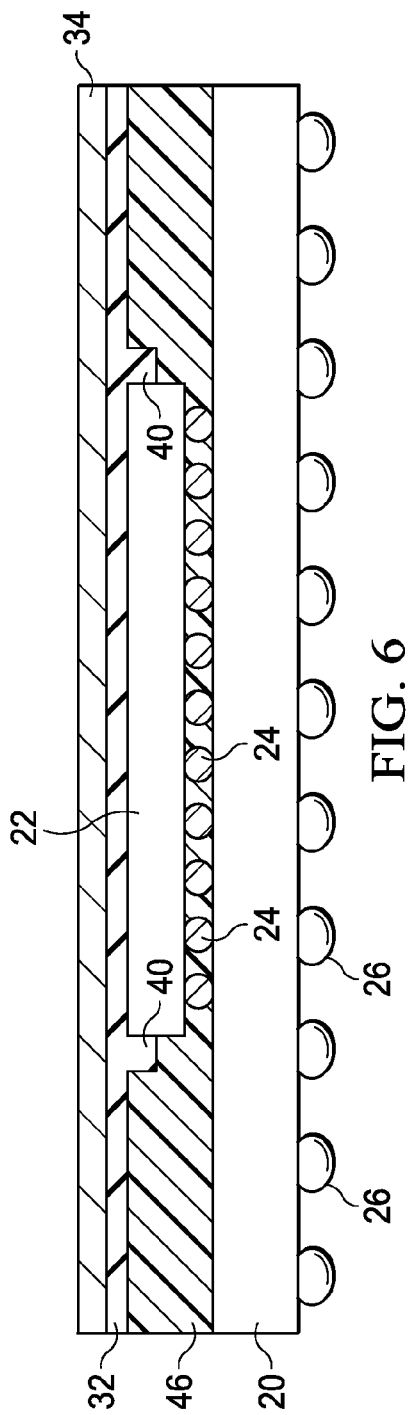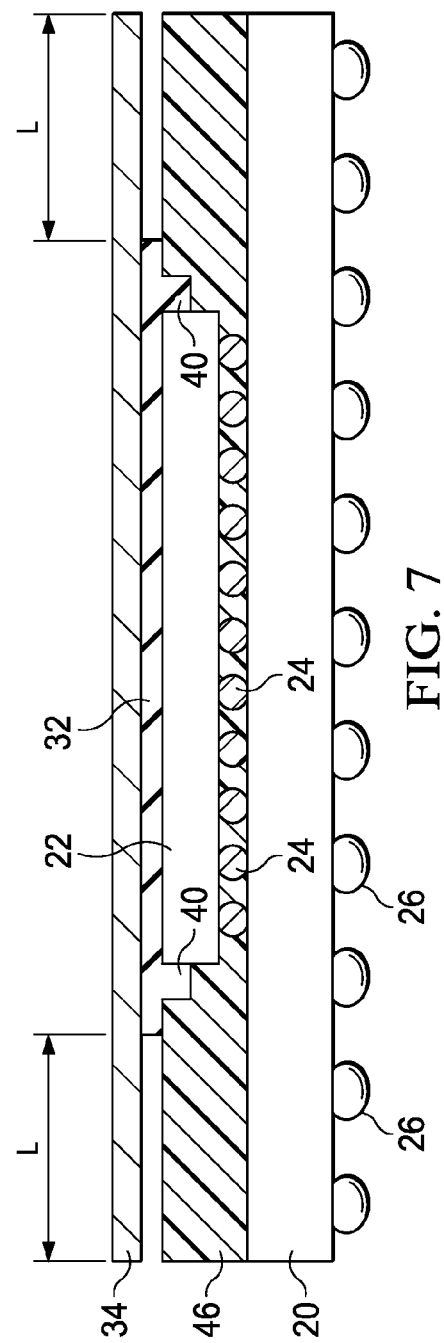

SEMICONDUCTOR DEVICE PACKAGE AND METHOD

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

However, some FcCSP packages tend to exhibit bending, where warping of the substrate occurs during processing, such as during temperature stress. The bending can cause reliability issues, such as bond breakage of the bumps, delamination of an underfill, and delamination of a passivation layer on the die.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 6 is a package comprising an encapsulant with recesses according to an embodiment;

FIG. 7 is a package comprising an encapsulant with recesses according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order. Further, like reference numbers or indicators refer to like components.

Figure 1:
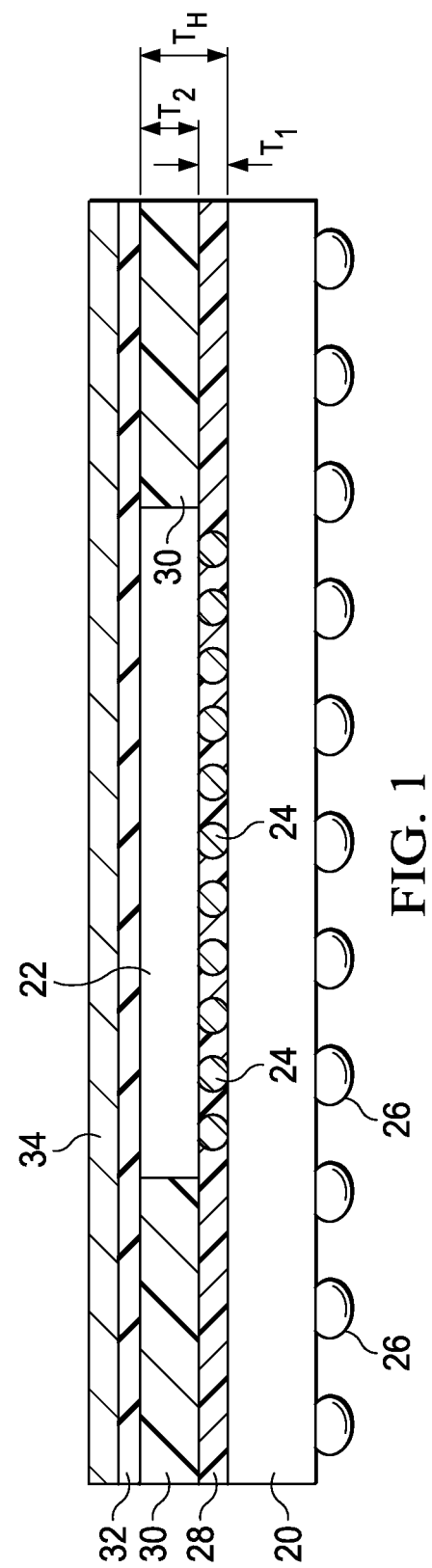
FIG. 1 is a package comprising a hybrid encapsulant according to an embodiment.

FIG. 1 illustrates a first package comprising a hybrid encapsulant according to an embodiment. The package comprises a substrate 20 and a chip 22. The chip 22 is attached on a top surface of the substrate 20 by electrical connectors 24 on respective pads of the substrate 20. The substrate 20 in this embodiment is an organic substrate, such as comprising Ajinomoto Build-up Film (ABF), and can be formed by acceptable techniques. Other substrates, such as interposers, printed circuit boards, or the like, are contemplated as the substrate 20 in other embodiments. The chip 22 can be formed according to acceptable techniques, and embodiments contemplate a chip with any functionality. The electrical connectors 24 in this embodiment are metal posts, such as copper, with a lead free solder, such as a eutectic material such as SnAgCu ("SAC"), formed thereon. The electrical connectors 24 can also be Controlled Collapsible Chip Connection (C4) or other bumps formed by acceptable methods. The chip 22 is attached to the substrate 20 using, for example, a pick-and-place tool, and the electrical connectors 24 are reflowed. Although FIG. 1 illustrates one chip 22, other embodiments contemplate multiple chips, e.g., two or more, directly connected to the top surface of the substrate 20 by electrical connectors, and/or contemplate stacked chips. Although not present in this embodiment, an underfill material may be between the chip 22 and the top surface of the substrate 20 and around the electrical connectors 24.

The hybrid encapsulant surrounds and encapsulates the chip 22 and comprises a first molding compound 28 and a second molding compound 30. The first molding compound 28 and the second molding compound 30 have different thermal and mechanical properties in this embodiment, such as by having different compositions of material. Each of the first molding compound 28 and second molding compound 30 can be modified to have particular mechanical and/or thermal properties by adjusting a ratio of a filler(s) to an epoxy in the respective molding compound, for example. An example filler is an inorganic material, such as alumina, silica, or the like. The first molding compound 28 can be a relatively compliant material, such as by having a Young's modulus lower than about 10 GPa, and the second molding compound 30 can have a high thermal conductivity for heat dissipation, such as by having a coefficient of thermal expansion (CTE) lower than about $25\times10^{-6}$. For example, the first molding compound 28 can have a higher CTE than the second molding compound 30, and the second molding compound 30 can have a higher Young's modulus than the first molding compound 28. In a specific example, the first molding compound 28 has a CTE of $1.73\times10^{-5}$ and a Young's modulus of 12 GPa, and the second molding compound 30 has a CTE of $1.1\times10^{-5}$ and a Young's modulus of 21 GPa. This example may be achieved by the second molding compound 30 having a higher filler content than the first molding compound 28. The filler content of the first molding compound 28 may be between about 20% and about 50%, and the filler content of the second molding compound 30 may be between about 80% and about 90%.

The first molding compound 28 can be applied using, for example, injection molding or the like. The first molding compound 28 is cured, and the second molding compound 30 is applied over the first molding compound 28 using, for example, injection molding, compression molding, or the like. The second molding compound 30 is cured. Each of the first molding compound 28 and the second molding compound 30 extend laterally to the lateral edges of the substrate 20, such that respective lateral edges of the substrate 20, the first molding compound 28, and the second molding compound 30 are co-terminous.

The first molding compound 28 has a thickness $T_1$, and the second molding compound 30 has a thickness $T_2$. The hybrid encapsulant has a thickness $T_H$, which in this example is the combined thickness of thickness $T_1$ and thickness $T_2$, e.g., $T_1+T_2=T_H$. The thickness $T_1$ of the first molding compound 28 is from the top surface of the substrate 20 to a top surface of the first molding compound 28 in a direction perpendicular to the top surface of the substrate 20. The thickness $T_2$ of the second molding compound 30 is from the top surface of the first molding compound 28 to a top surface of the second molding compound 30 in the direction perpendicular to the top surface of the substrate 20. In this example, the top surface of the second molding compound 30 is co-planar with the top surface of the chip 22 such that the top surface of the chip 22 is exposed from the hybrid encapsulant, although in other embodiments the top surface of the second molding compound 30 may be above or below the top surface of the chip 22. The thickness $T_1$ of the first molding compound 28 and the thickness $T_2$ of the second molding compound 30 can be any percentage of the overall thickness $T_H$ of the hybrid encapsulant. In some embodiments, the thickness $T_1$ of the first molding compound 28 is between about 30% and about 50% of the overall thickness $T_H$ of the hybrid encapsulant, and thickness $T_2$ of the second molding compound 30 is between about 50% and about 70% of the overall thickness $T_H$ of the hybrid encapsulant.

Continuing the specific example from above, three samples were produced for experimentation. The samples were produced with a substrate 20 having a top surface area of 35 mm×35 mm and a chip 22 having a top surface area of 16 mm×16 mm. The first sample did not contain a hybrid encapsulant, but used the second molding compound 30 as the encapsulant without using the first molding compound 28. The second sample contained a hybrid encapsulant where the first molding compound 28 was 30% of the overall thickness $T_H$ and the second molding compound 30 was 70% of the overall thickness $T_H$. The third sample contained a hybrid encapsulant where the first molding compound 28 and second molding compound each were 50% of the overall thickness $T_H$. Measurements were taken of the warpage of the samples during thermal cycling, and the measured warpage was normalized using the measured warpage of the first sample, e.g., the normalized warpage of the first sample is 1. The first sample experienced a reduced warpage. The second sample also experienced a reduced warpage, although the warpage of the second sample was greater than the first.

As depicted in FIG. 1, a portion of the first molding compound 28 is between the chip 22 and the top surface of the substrate 20 and around the electrical connectors 24. In embodiments where an underfill is used, the first molding compound 28 may not be between the chip 22 and the substrate 20 and around the electrical connectors 24. In still other embodiments, portions of the first molding compound 28 and second molding compound 30 may be between the chip 22 and the top surface of the substrate 20 and around the electrical connectors 24.

Further, although depicted and described with the first molding compound 28 and the second molding compound 30, the hybrid encapsulant may comprise any number of molding compounds having varying compositions. For example, the hybrid encapsulant may further comprise a third molding compound over the second molding compound 30 that has a composition different from the first molding compound 28 and the second molding compound 30. Also, as an example, the hybrid encapsulant may comprise two layers of each of the first molding compound 28 and the second molding compound 30 that alternate. A person of ordinary skill in the art will readily understand any modification necessary to achieve these embodiments.

The package further comprises a lid 34, which may also be a heat spreader, attached to the top surface of the second molding compound 30 and the top surface of the chip 22 using a thermal interface material 32. The lid 34 in this embodiment is planar, although in other embodiments, the lid 34 may be contoured to various contours of a package, such as if the hybrid encapsulant has a top surface below the top surface of the chip 22. In still other embodiments, the lid 34 may be a ring or other structure. The lid 34 in this embodiment is steel and, in other embodiments, can be copper, stainless steel, the like, or a combination thereof. The thermal interface material 32 may be a thermally conductive and electrically insulative material, such as an epoxy, like an epoxy mixed with a metal like silver or gold, a "thermal grease," a "white grease," the like, or a combination thereof. The thermal interface material 32 may be dispensed on the top surfaces of the second molding compound 30 and the chip 22. The lid 34 may then be placed, using a pick-and-place tool, on the thermal interface material 32 to attach the lid 34 to the remainder of the package. In this embodiment, the thermal interface material 32 and the lid 34 extend laterally to the lateral edges of the substrate 20, the first molding compound 28, and the second molding compound 30, such that respective lateral edges of the substrate 20, the first molding compound 28, the second molding compound 30, the thermal interface material 32, and the lid 34 are co-terminous.

FIG. 1 further illustrates electrical connectors 26, such as a ball grid array (BGA), on a bottom surface of the substrate 20 that is opposite the top surface of the substrate 20. The electrical connectors 26 may be lead free solder or the like. The package may be placed on another board, and the electrical connectors 26 may be reflowed to connect the package to the board.

Figure 2:
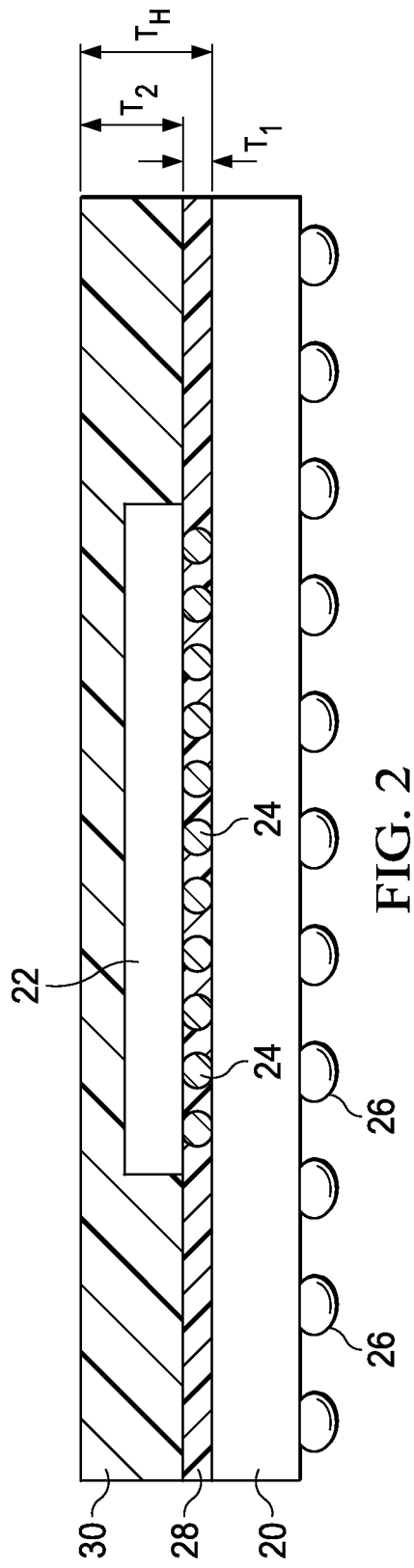
FIG. 2 is a package comprising a hybrid encapsulant without a lid and thermal interface material according to an embodiment.

FIG. 2 illustrates a second package comprising a hybrid encapsulant without a lid and thermal interface material according to an embodiment. The package of FIG. 2 is generally similar to the package of FIG. 1, but no lid or thermal interface material is present. The second molding compound 30 has a thickness $T_2$ sufficient to cover the top surface of the chip 22. For example, the combined thickness $T_H$ of the first molding compound 28 and the second molding compound 30 is greater than the height of the chip 22 from the top surface of the substrate 20. In this example, the hybrid encapsulant may have sufficient thermo-mechanical properties to obviate a need for a lid and a thermal interface material, such as when the second molding compound 30 has a high Young's modulus to possess sufficient thermal conductivity for thermal spreading and when the first molding compound 28 has a high CTE to control warpage. This embodiment may be desirable for a low-cost thermal solution for low-power consumer electronic products, such as smartphones or tablet PCs.

Figure 3:
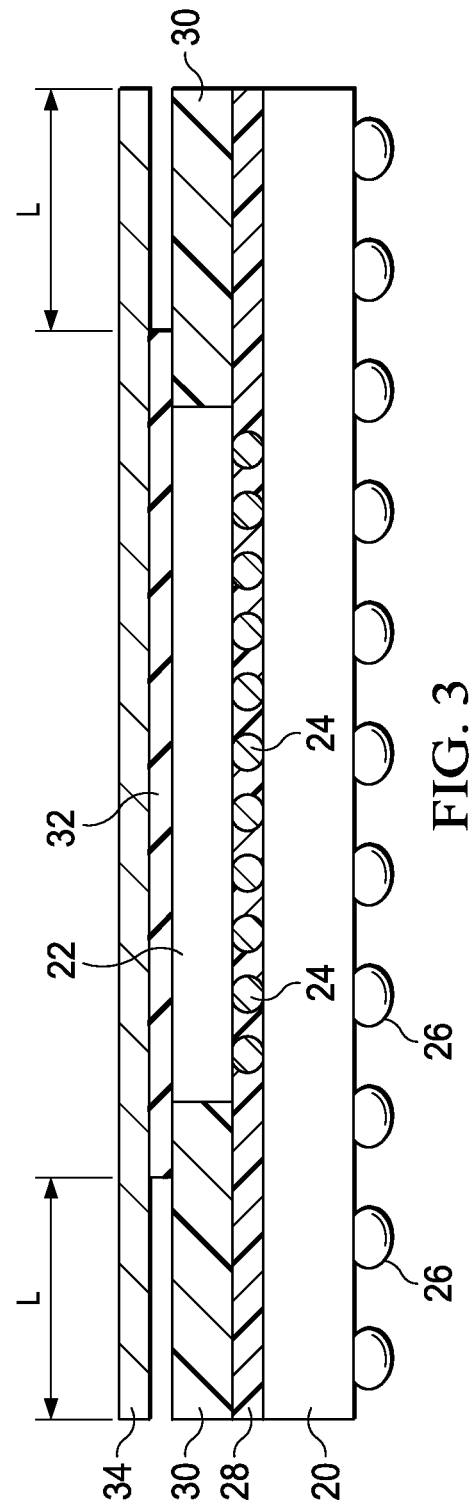
FIG. 3 is a package comprising a hybrid encapsulant according to an embodiment.

FIG. 3 illustrates a third package comprising a hybrid encapsulant according to an embodiment. The package of FIG. 3 is the same as the package of FIG. 1, except the lateral edges of the thermal interface material 32 are not co-terminous with lateral edges of the substrate 20, the first molding compound 28, the second molding compound 30, and the lid 34. A lateral distance L separates the lateral edges of the thermal interface material 32 from the lateral edges of the substrate 20, the first molding compound 28, the second molding compound 30, and the lid 34. The lateral distance L may be uniform around a periphery of the package, although in some embodiments, the lateral distance L may vary between different locations in the package. In this embodiment, the thermal interface material 32 covers the top surface of the chip 22 and only a portion of the second molding compound 30 proximate the chip 22.

Figure 4:
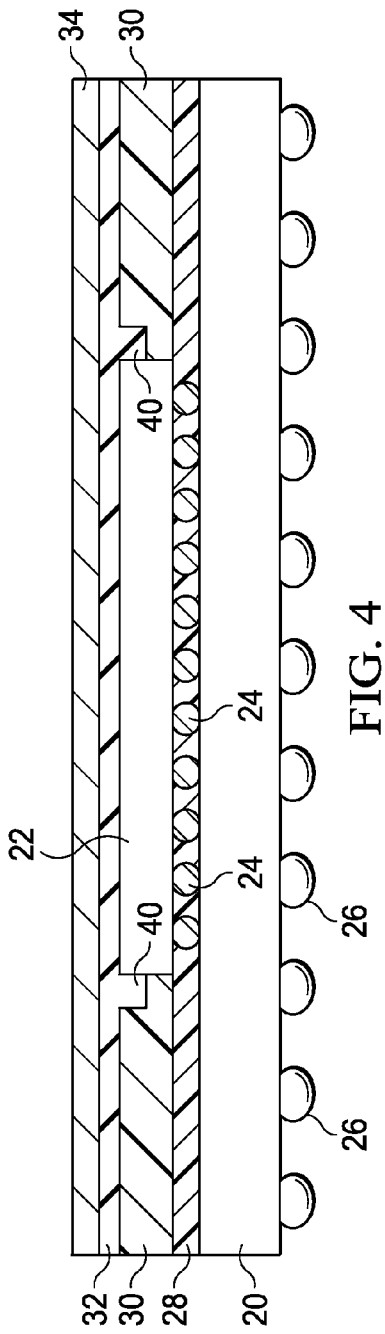
FIG. 4 is a package comprising a hybrid encapsulant with recesses according to an embodiment.

FIG. 4 illustrates a fourth package comprising a hybrid encapsulant according to an embodiment. The package of FIG. 4 is the same as the package of FIG. 1, except the hybrid encapsulant comprises recesses 40 in the top surface of the second molding compound 30 near or adjacent to the chip 22. The recesses 40 can be formed by using laser ablation after the second molding compound 30 is cured. The thermal interface material 32 can fill the recesses 40 when the thermal interface material 32 and/or lid 34 is applied to the package. More details of the recesses 40 are discussed below with respect to FIGS. 8 through 10.

Figure 5:
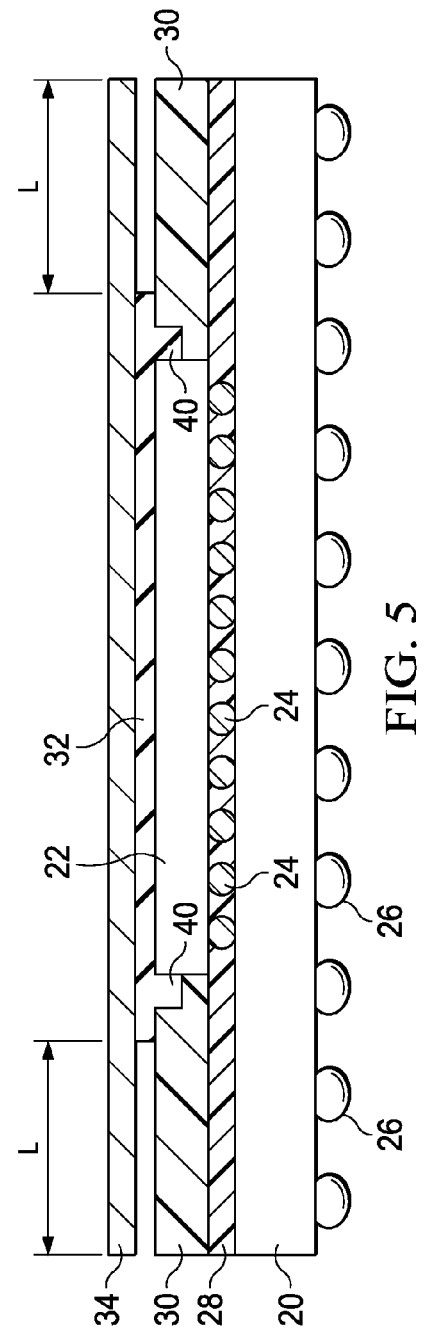
FIG. 5 is a package comprising a hybrid encapsulant with recesses according to an embodiment.

FIG. 5 illustrates a fifth package comprising a hybrid encapsulant according to an embodiment. The package of FIG. 5 is the same as the package of FIG. 1, except the package of FIG. 5 combines the modifications discussed in FIGS. 3 and 4. Accordingly, further explicit discussion of the modifications in FIG. 5 is omitted for brevity.

FIG. 6 illustrates a sixth package according to an embodiment. The package of FIG. 6 comprises a molding compound 46 as the encapsulant. In this embodiment, the molding compound 46 may be a single material having a substantially uniform composition from the top surface of the substrate 20 to the top surface of the molding compound 46. The molding compound 46 may be any acceptable molding compound. After the chip 22 is attached to the substrate 20, as discussed above, the molding compound 46 may be applied using, for example, injection molding, compression molding, or the like, and may be subsequently cured. In this example, the top surface of the molding compound 46 is co-planar with the top surface of the chip 22 such that the top surface of the chip 22 is exposed from the molding compound 46, although in other embodiments the top surface of the molding compound 46 may be above or below the top surface of the chip 22. The molding compound 46 has recesses 40 in the top surface of the molding compound 46 near or adjacent to the chip 22. The recesses 40 can be formed by using laser ablation after the molding compound 46 is cured. The thermal interface material 32 can fill the recesses 40 when the thermal interface material 32 and/or lid 34 is applied to the package. More details of the recesses 40 are discussed below with respect to FIGS. 8 through 10.

FIG. 7 illustrates a seventh package according to an embodiment. The package of FIG. 7 is the same as the package of FIG. 6, except the lateral edges of the thermal interface material 32 are not co-terminous with lateral edges of the substrate 20, the molding compound 46, and the lid 34. A lateral distance L separates the lateral edges of the thermal interface material 32 from the lateral edges of the substrate 20, the molding compound 46, and the lid 34. The lateral distance L may be uniform around a periphery of the package, although in some embodiments, the lateral distance L may vary between different locations in the package. In this embodiment, the thermal interface material 32 covers the top surface of the chip 22 and only a portion of the molding compound 46 proximate the chip 22.

Figure 8:
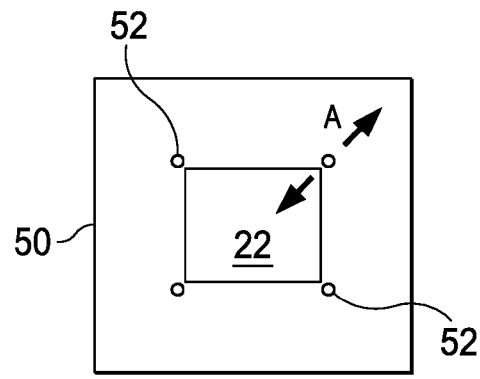
FIG. 8 is a configuration of recesses in a molding compound according to an embodiment.
Figure 9:
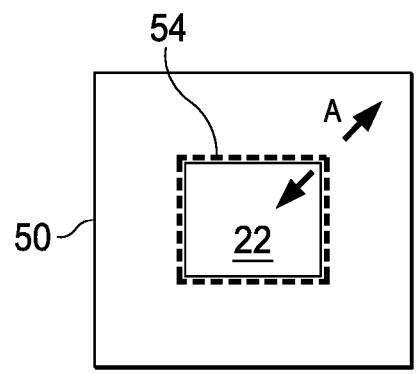
FIG. 9 is a configuration of recesses in a molding compound according to an embodiment.

FIGS. 8 and 9 are plan views of top surfaces of a molding compound 50 and the chip 22, where the molding compound 50 has recesses. In these FIGS. 8 and 9, molding compound 50 is used generically to refer to the second molding compound 30 and/or the molding compound 46 of the foregoing figures, or another molding compound of an embodiment. The molding compound 50 in FIG. 8 has four circular recesses 52 with each recess 52 being proximate or adjacent to a respective corner of the chip 22. The molding compound 50 in FIG. 9 has broken trench recesses 54 that circumscribe the periphery of the chip 22. Other embodiments contemplate any configuration of recesses, such as a full trench circumscribing the chip and any variation between the recesses 52 and broken trench recesses 54.

Figure 10:
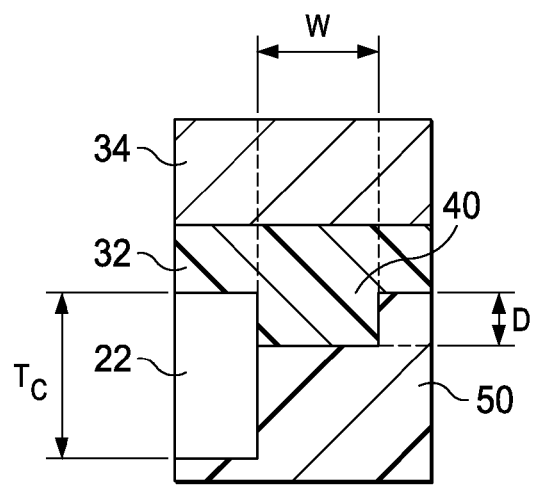
FIG. 10 illustrates dimensions of a recess in a package according to an embodiment.

FIG. 10 illustrates a portion of a package comprising a recess 40. FIG. 10 is a cross sectional view along, e.g., cross section A in FIGS. 8 and 9. The recess 40 may be any of the recesses 52 and 54 or another recess configuration. FIG. 10 illustrates a depth D and width W (or diameter) of the recess 40. The depth D is in a direction perpendicular to the top surface of the molding compound 50, and the width W is in a direction extending away from the chip 22 and in a plane parallel to the top surface of the molding compound 50. The chip 22 also has a thickness $T_C$. Embodiments contemplate that the width W and the depth D can be any value. In specific embodiments, the width W is between about 80 μm and about 100 μm, and the depth D is half of the thickness $T_C$ of the chip 22.

Various samples were produced to determine an effect of the depth D and width W on a produced package. During thermal cycling, stresses may be applied to the electrical connectors 24 due to, for example, mismatching CTEs of various components, which may in turn further lead to warpage. The stresses on the electrical connectors 24 may lead to some of the electrical connectors 24 cracking. Samples were created similar to the package of FIG. 6, except without the recesses 40. With these samples, a risk probability of electrical connectors 24 cracking was determined and used as a baseline to normalize a risk probability for other samples. Other samples were produced according to the package of FIG. 6. A first set of these samples were produced with recesses with a constant depth D of 37.5 μm and a varying width W, with widths of 87.9 μm, 142.9 μm, and 197.9 μm. The risk probability of electrical connectors 24 cracking in this first set of samples with widths that varied among the set did not vary appreciably from the baseline. A second set of samples were produced with recesses with a constant width W of 87.9 μm and a varying depth D, with depths of 72.5 μm, 107.5 μm, and 142.5 μm. The risk probability of electrical connectors 24 cracking in this second set of samples with depths that varied among the set decreased compared to the baseline. Additionally, packages comprising recesses 40 were observed to have decreased delamination of the thermal interface material 32.

Figure 11:
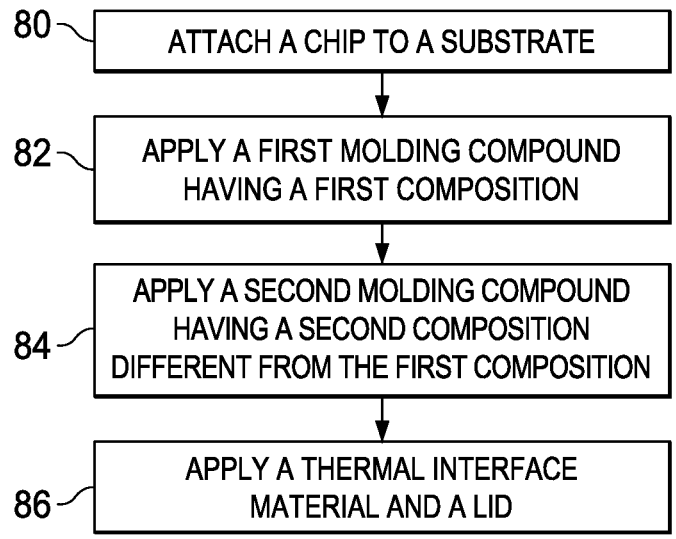
FIG. 11 is a process flow to produce a package according to an embodiment.

FIG. 11 is a first process flow to produce a package according to an embodiment. In step 80, a chip is attached to a substrate, such as by reflowing electrical connectors 24 between the chip 22 and the substrate 20 as previously discussed. In step 82, a first molding compound having a first composition, such as the first molding compound 28, is applied around the periphery of the chip and on the top surface of the substrate, such as illustrated in FIGS. 1 through 5, using injection molding or the like and curing the first molding compound, for example. In step 84, a second molding compound having a second composition different from the first composition, such as the second molding compound 30, is applied around the periphery of the chip and on the top surface of the first molding compound, such as illustrated in FIGS. 1 through 5, using injection molding, compression molding, or the like and curing the second molding compound, for example. In step 86, a thermal interface material and lid, such as thermal interface material 32 and lid 34 above, are applied to the top surface of the chip and/or second molding compound, for example, by coating the top surface of the chip and/or second molding compound with the thermal interface material and using a pick-and-place tool to attach the lid to the thermal interface material. The thermal interface material may have lateral edges that are co-terminous with the lateral edges of other components of the package, like in FIGS. 1 and 4, or the thermal interface material may have lateral edges that are not co-terminous with the lateral edges of other components of the package, like in FIGS. 3 and 5.

Figure 12:
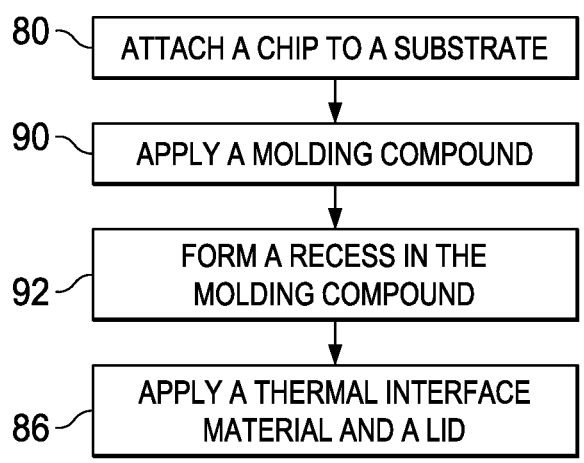
FIG. 12 is a process flow to produce a package according to an embodiment.

FIG. 12 is a second process flow to produce a package according to another embodiment. After attaching a chip to a substrate in step 80 that is discussed with respect to FIG. 11, a molding compound is applied around the periphery of the chip and on the top surface of the substrate, such as illustrated in FIGS. 4 through 7, using injection molding, compression molding, or the like and curing the molding compound, for example. The molding compound may be any acceptable molding compound, such as molding compound 46 in FIGS. 6 and 7; may be the first molding compound 28 and the second molding compound 30 in FIGS. 4 and 5 formed by steps 82 and 84 in FIG. 11; or may be the like. In step 92, a recess, such as recess 40 in FIGS. 4 through 7, is formed in the top surface of the molding compound near or adjacent to the chip using, for example, laser ablation or the like. The recess can have any configuration, such as the configurations of FIGS. 8 and 9 or the like. In step 86, a thermal interface material and lid, such as thermal interface material 32 and lid 34 above, are applied to the top surface of the chip and/or molding compound, for example, by coating the top surface of the chip and/or molding compound with the thermal interface material and using a pick-and-place tool to attach the lid to the thermal interface material. The thermal interface material fills the recess. The thermal interface material may have lateral edges that are co-terminous with the lateral edges of other components of the package, like in FIGS. 4 and 6, or the thermal interface material may have lateral edges that are not co-terminous with the lateral edges of other components of the package, like in FIGS. 5 and 7.

An embodiment is a package. The package comprises a substrate, a chip electrically and mechanically attached to a surface of the substrate by electrical connectors, and a hybrid encapsulant encapsulating the chip. The hybrid encapsulant comprises a first molding compound and a second molding compound. The first molding compound is on the surface of the substrate and around a periphery of the chip. The second molding compound is on the first molding compound and around the periphery of the chip, and the second molding compound has a different composition than the first molding compound.

Another embodiment is a package. The package comprises a substrate, a chip electrically and mechanically attached to a surface of the substrate by electrical connectors, an encapsulant encapsulating the chip, a thermal interface material, and a lid attached to the thermal interface material. A surface of the chip is exposed through the encapsulant, and the surface of the chip is distal from the substrate. The encapsulant comprises a first molding compound. The first molding compound comprises a recess in a surface of the first molding compound proximate the surface of the chip. The thermal interface material is on the surface of the chip and in the recess.

A further embodiment is a method. The method comprises attaching a chip to a surface of a substrate, applying a first molding compound on the surface of the substrate and around the chip, and applying a second molding compound on the first molding compound and around the chip. The second molding compound has a different composition than the first molding compound.

A still further embodiment is a method. The method comprises attaching a chip to a surface of a substrate; applying a first molding compound encapsulating the chip; forming a recess in a surface of the first molding compound, a surface of the chip being co-planar with the surface of the first molding compound, the recess being proximate the surface of the chip; applying a thermal interface material on the surface of the chip and in the recess; and attaching a lid to the thermal interface material.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package comprising:
   a substrate;
   a chip electrically and mechanically attached to a surface of the substrate by electrical connectors; and
   a hybrid encapsulant encapsulating the chip, the hybrid encapsulant comprising a first molding compound and a second molding compound, the first molding compound being on the surface of the substrate and around a periphery of the chip, the second molding compound being on the first molding compound and around the periphery of the chip, the first molding compound and the second molding compound having coterminous exterior edges, the exterior edges being located opposite from respective edges of the first molding compound and the second molding compound proximate to the chip, the second molding compound having a different composition than the first molding compound.

2. The package of claim 1 further comprising:
a thermal interface material on the hybrid encapsulant, the chip, or a combination thereof; and
a lid attached to the thermal interface material.

3. The package of claim 1, wherein the first molding compound has a higher coefficient of thermal expansion (CTE) than the second molding compound.

4. The package of claim 1, wherein the second molding compound has a higher Young's modulus than the first molding compound.

5. The package of claim 1, wherein the second molding compound has a higher filler content percentage than the first molding compound.

6. The package of claim 1, wherein a thickness of the first molding compound is equal to or less than a thickness of the second molding compound.

7. A package comprising:
a substrate;
a chip electrically and mechanically attached to a surface of the substrate by electrical connectors;
an encapsulant encapsulating the chip, a surface of the chip being exposed through the encapsulant, the surface of the chip being distal from the substrate, the encapsulant comprising a first molding compound, the first molding compound comprising a recess in a surface of the first molding compound proximate the surface of the chip;
a thermal interface material on the surface of the chip and in the recess; and
a lid attached to the thermal interface material.

8. The package of claim 7, wherein the encapsulant further comprises a second molding compound, the first molding compound being on the second molding compound, the second molding compound having a different composition than the first molding compound.

9. The package of claim 7, wherein the recess comprises a discrete recess in the surface of the first molding compound and at each corner of the surface of the chip.

10. The package of claim 7, wherein the recess comprises broken trench recesses in the surface of the first molding compound and circumscribing the surface of the chip.

11. The package of claim 7, wherein the chip has a thickness in a direction perpendicular to the surface of the substrate, the recess having a depth in the direction perpendicular to the surface of the substrate that is half the thickness of the chip.

12. The package of claim 7, wherein the recess has a width in a plane parallel to the surface of the substrate and in a direction extending away from the chip, the width being between 80 µm and 100 µm.

13. A method comprising:
attaching a chip to a surface of a substrate;
applying a first molding compound on the surface of the substrate and around the chip; and
applying a second molding compound on the first molding compound and around the chip, the first molding compound and the second molding compound having coterminous exterior edges, the exterior edges being located opposite from respective edges of the first molding compound and the second molding compound proximate to the chip, the second molding compound having a different composition than the first molding compound.

14. The method of claim 13, wherein the applying the first molding compound comprises using injection molding and curing the first molding compound before applying the second molding compound.

15. The method of claim 13 further comprising:
applying a thermal interface material to the second molding compound; and
attaching a lid to the thermal interface material.

16. The method of claim 13, wherein the second molding compound has (i) a lower coefficient of thermal expansion (CTE) than the first molding compound, (ii) a higher Young's modulus than the first molding compound, (iii) a higher filler content percentage than the first molding compound, or (iv) a combination thereof.

17. A method comprising:
attaching a chip to a surface of a substrate;
applying a first molding compound encapsulating the chip;
forming a recess in a surface of the first molding compound, a surface of the chip being co-planar with the surface of the first molding compound, the recess being proximate the surface of the chip;
applying a thermal interface material on the surface of the chip and in the recess; and
attaching a lid to the thermal interface material.

18. The method of claim 17 further comprising applying a second molding compound encapsulating the chip, the first molding compound being applied on the second molding compound, the first molding compound having a different composition than the second molding compound.

19. The method of claim 17, wherein the forming the recess comprises using laser ablation.

20. The method of claim 17, wherein the chip has a thickness in a direction perpendicular to the surface of the substrate, the recess having a depth in the direction perpendicular to the surface of the substrate that is half the thickness of the chip.

* * * * *